US006940987B2

(12) United States Patent
Claesson

(10) Patent No.: US 6,940,987 B2
(45) Date of Patent: Sep. 6, 2005

(54) TECHNIQUES FOR IMPROVING AUDIO CLARITY AND INTELLIGIBILITY AT REDUCED BIT RATES OVER A DIGITAL NETWORK

(75) Inventor: Leif Hakan Claesson, Berkeley, CA (US)

(73) Assignee: Plantronics Inc., Santa Cruz, CA (US)

( * ) Notice: Subject to any disclaimer, the term of this patent is extended or adjusted under 35 U.S.C. 154(b) by 580 days.

(21) Appl. No.: 09/669,069

(22) Filed: Dec. 20, 2000

(65) Prior Publication Data

US 2004/0215358 A1 Oct. 28, 2004
US 2005/0096762 A2 Oct. 28, 2004

Related U.S. Application Data

(60) Provisional application No. 60/174,118, filed on Dec. 31, 1999.

(51) Int. Cl.[7] .................................................. H03G 3/00
(52) U.S. Cl. ......................... 381/107; 381/104; 381/98; 381/99
(58) Field of Search ................................ 381/107, 104, 381/109, 98, 99, 100, 101, 103, 312; 704/500, 200.01

(56) References Cited

U.S. PATENT DOCUMENTS 4,803,732 A 2/1989 Dillon ........................ 381/320
4,891,839 A 1/1990 Scheiber ...................... 381/22
4,901,307 A 2/1990 Gilhousen et al. ............ 370/18
5,179,730 A 1/1993 Loper ......................... 455/266
5,263,019 A 11/1993 Chu
5,303,306 A * 4/1994 Brillhart et al. ............ 381/315
5,305,307 A 4/1994 Chu
5,321,514 A 6/1994 Martinez .................... 348/723
5,365,583 A 11/1994 Huang et al.
5,524,148 A 6/1996 Allen et al. ................. 379/391

(Continued)

FOREIGN PATENT DOCUMENTS

WO WO 98/56210 10/1998 ........... H04R/25/00

*Primary Examiner*—Sinh Tran
*Assistant Examiner*—Justin Michalski
(74) *Attorney, Agent, or Firm*—Beyer Weaver & Thomas LLP

(57) ABSTRACT

In accordance with an embodiment of the present invention, a dynamics processor includes a non-linear automatic gain control (AGC) responsive to an input audio signal comprised of a plurality of frequency components, each frequency component having associated therewith an amplitude, said non-linear AGC adaptive to develop a modified gain audio signal. A multiband cross-over device is responsive to the modified gain audio signal and is adaptive to generate 'n' number of signals, each of said 'n' signals having an amplitude and further having a unique frequency band associated therewith. The dynamics processor further includes 'n' number of processing blocks, each of which is responsive to a respective one of said 'n' signals for modifying the amplitude of the 'n' signals to develop modified 'n' signals; and a mixer device is responsive to said modified 'n' signals and adaptive to combine the same, wherein the amplitude of the plurality of frequencies associated with the audio signal is modified in real-time thereby enhancing the audibility of the audio signal.

15 Claims, 8 Drawing Sheets

U.S. PATENT DOCUMENTS 5,550,924 A 8/1996 Helf et al.
5,625,871 A 4/1997 Myer et al. ................ 455/33.1
5,724,340 A 3/1998 Jones et al. ................. 370/203
5,771,301 A 6/1998 Fuller et al. ................ 381/107
5,778,082 A 7/1998 Chu et al.
5,787,183 A 7/1998 Chu et al.
5,815,206 A * 9/1998 Malladi et al. ........ 375/240.01
5,832,444 A 11/1998 Schmidt ..................... 704/500
5,915,235 A 6/1999 DeJaco ....................... 704/234
5,956,674 A 9/1999 Smyth et al. ............ 704/200.1
6,038,435 A 3/2000 Zhang ..................... 455/234.1
6,044,162 A 3/2000 Mead ......................... 381/312
6,061,405 A 5/2000 Emami ....................... 375/260
6,097,824 A * 8/2000 Lindemann et al. ........ 381/315
6,118,878 A 9/2000 Jones .......................... 381/72
6,212,273 B1 4/2001 Hemkumar et al.
6,282,176 B1 8/2001 Hemkumar
6,285,767 B1 * 9/2001 Klayman ..................... 381/17
6,324,509 B1 11/2001 Bi et al.
6,351,731 B1 2/2002 Anderson et al.
6,381,570 B2 4/2002 Li et al.
6,418,303 B1 7/2002 Blackburn et al. ....... 455/234.2
6,434,246 B1 8/2002 Kates et al.
6,721,411 B2 4/2004 O'Malley et al.
6,731,767 B1 5/2004 Blamey et al.

* cited by examiner

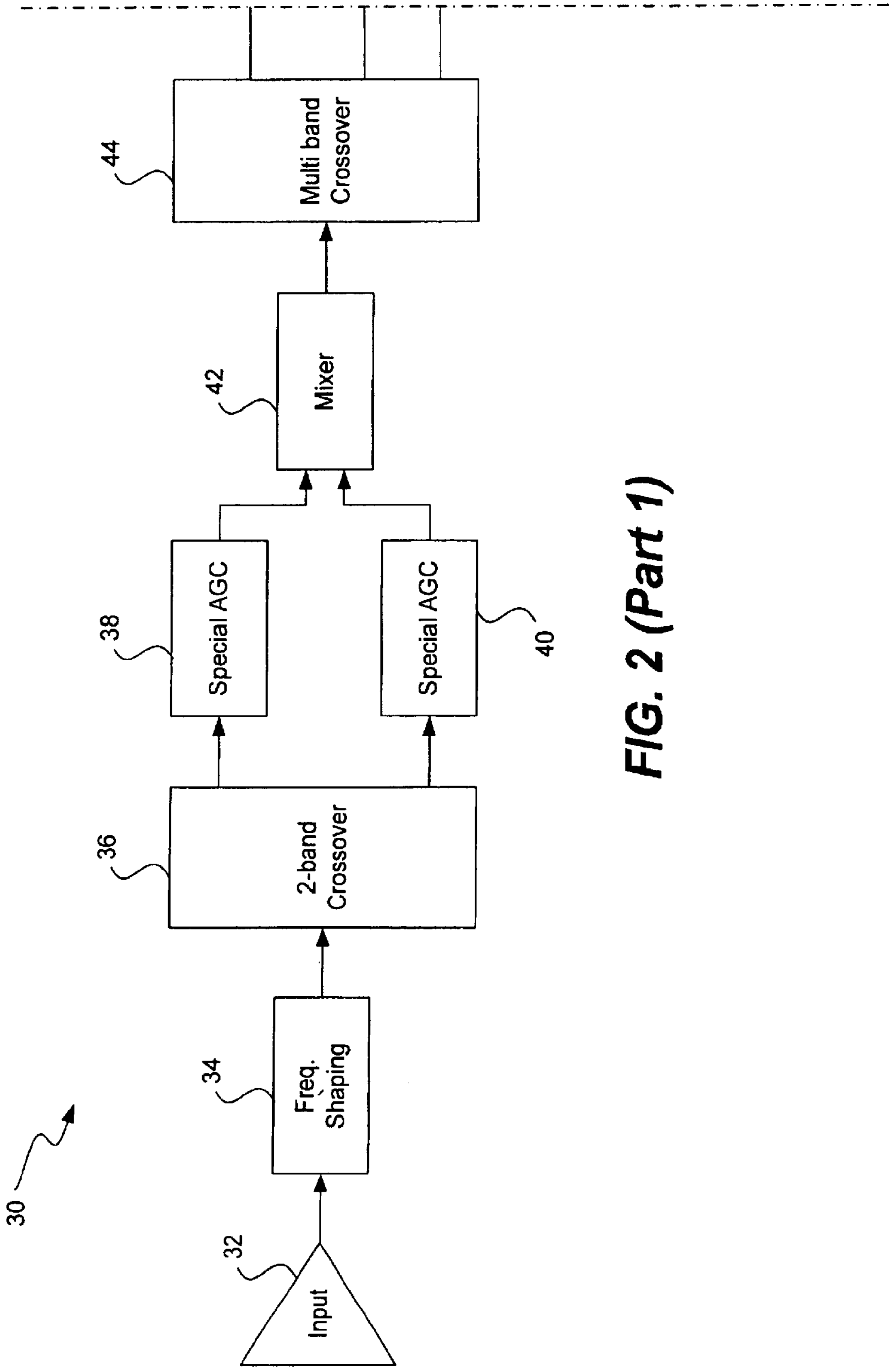
FIG. 2 (Part 1)

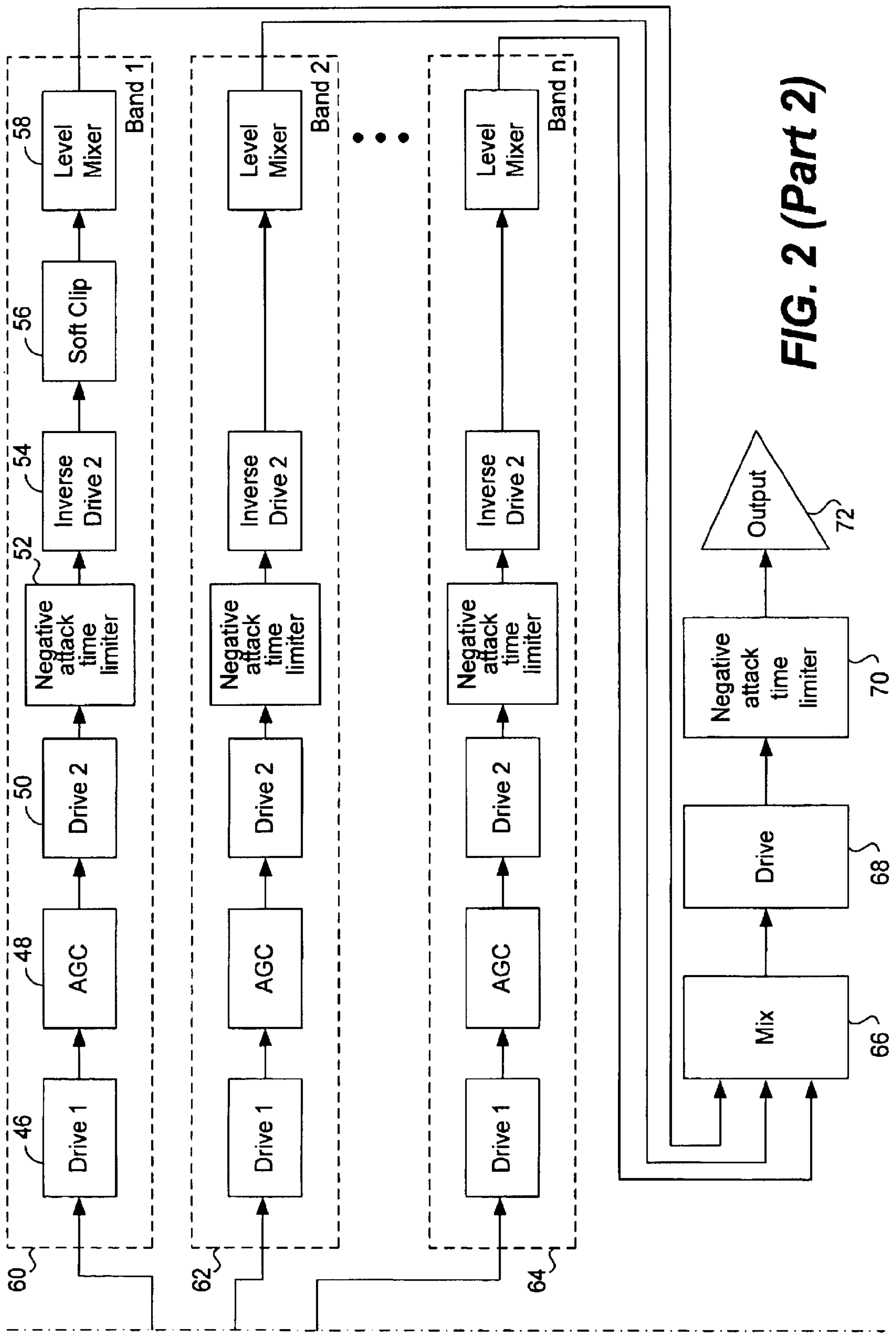
FIG. 2 (Part 2)

TECHNIQUES FOR IMPROVING AUDIO CLARITY AND INTELLIGIBILITY AT REDUCED BIT RATES OVER A DIGITAL NETWORK

CROSS REFERENCE TO RELATED APPLICATIONS

This application claims the benefit of U.S. Provisional Application 60/174,118, filed on Dec. 31, 1999, and entitled "Techniques For Improving Audio Clarity and Intelligibility at Reduced Bit Rates Over a Digital Network".

BACKGROUND OF THE INVENTION

1. Field of the Invention

The present invention relates to techniques for improving transmission of audio signals over a digital network and particularly to improving audio clarity and intelligibility at reduced bit rates over a digital network.

2. Description of the Prior Art

The growth of the Internet is doubling every 18 months, with over 57 million Domain hosts as of July 1999. In the United States, 42% of the population has Internet access. The use of audio transmitted over the Internet is growing even faster. According to iRadio (February 1999), 13% of all Americans have listened to radio on the world wide web, which is up from 6% only half a year before. However, the delivery of audio over the Internet is limited by low bit rate connections. The present invention enhances the quality of audio (Music or Voice) for transmission over a digital network, such as the Internet, before it is transmitted over the network. This invention enhances audio delivered separately or as part of a video download or video stream.

Audio that is broadcast over the Internet in real-time is called streaming audio. Radio stations, concerts, speeches and lectures are all delivered over the web in streaming form. Encoders such as those offered by Microsoft and Real Audio reside on servers that deliver the audio stream at multiple bit rates over various connections (modem, T1, DSL, ISDN etc.) to the listener's computer. Upon receipt, the streamed data is decoded by a "player" that understands the particular encoding format.

FIG. 1 shows the basic transport path of audio over the network. The Audio Server 10 sends digital audio files through a connection such as a T1 line 12 to a digital network 18 such as the Internet using a defined protocol such as Transport Control Protocol/Internet Protocol (TCP/IP). From the network 18 the listener can connect his client computer 15 to the network 18 using a point-to-point (POP) connection 14. As the audio files enter the client computer they can be listened through the speakers 16.

To improve audio clarity and intelligibility it is desirable to equalize the amplitude of sound and music over time intervals as well as across the entire frequency spectrum. In particular, when music or voice becomes louder and softer and most of the high volume sound is concentrated in a narrow frequency band the need to equalize the sound amplitude over different frequencies becomes greater.

At present, there are radio broadcasting systems such as Orban and other music production systems capable of equalizing voice and music in real-time and over a range of frequencies. However, such systems generally require a sophisticated operator and powerful hardware for implementation, which makes them both labor-intensive and expensive. Due to its enhanced quality, transmission of processed audio at lower bit rates can have more clarity and presence than transmission of non-processed audio at higher bit rates. The result is an increase in bandwidth availability in a given network.

Therefore, the need arises for a method and apparatus for improving audio transmission across any digital network, such as the Internet, in real-time and by enhancing audio quality and intelligibility at reduced bit rates.

SUMMARY OF THE INVENTION

Briefly, a dynamics processor, in a accordance with an embodiment of the present invention, includes a non-linear automatic gain control (AGC) responsive to an input audio signal comprised of a plurality of frequency components, each frequency component having associated therewith an amplitude, said non-linear AGC adaptive to develop a gain-modified audio signal. A multiband cross-over device is responsive to the gain-modified audio signal and is adaptive to generate 'n' number of signals, each of said 'n' signals having an amplitude and further having a unique frequency band associated therewith. The dynamics processor further includes 'n' number of processing blocks, each of which is responsive to a respective one of said 'n' signals for modifying the amplitude of the 'n' signals to develop modified 'n' signals; and a mixer device is responsive to said modified 'n' signals and adaptive to combine the same, wherein the amplitude of the plurality of frequencies associated with the audio signal is modified in real-time thereby enhancing the audibility of the audio signal.

The foregoing and other objects, features and advantages of the present invention will be apparent from the following detailed description of the preferred embodiments which make reference to several figures of the drawing.

IN THE DRAWINGS

FIG. 2 shows a generalized dynamics processor used in processing audio signals according to an implementation of the present invention.

FIG. 3(*b*) shows a flowchart outlining the computations required to obtain the low pass and high pass outputs.

DETAILED DESCRIPTION OF THE PREFERRED EMBODIMENTS

Figure 1:
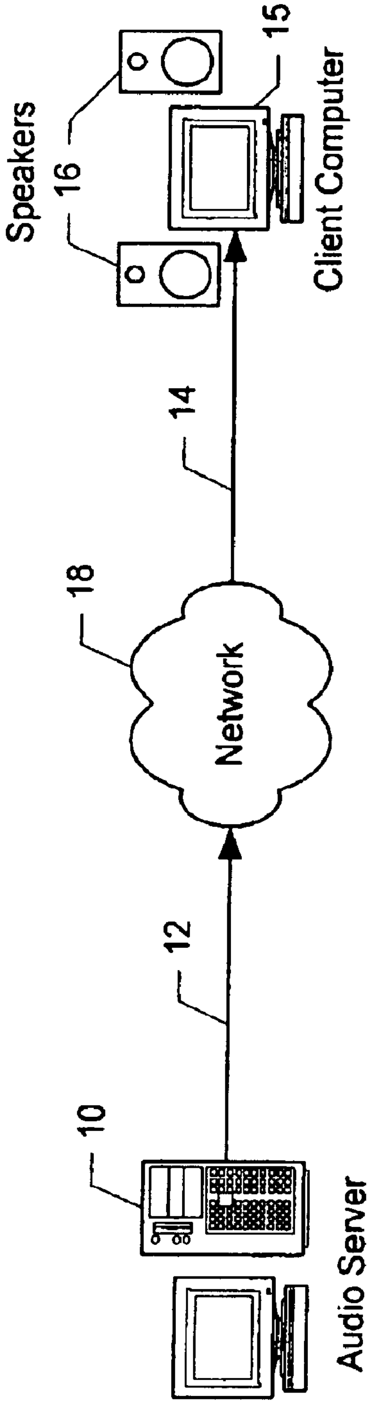
FIG. 1 (Prior Art)
FIG. 1 shows a prior art communication system for processing sound signals.

Referring now to FIG. 2, a block diagram of a generalized dynamics processor 30 is shown for processing audio signals according to one implementation of the present invention. The general dynamics processor 30 is implemented entirely in SW and may be incorporated within the audio server 10 shown in FIG. 1 or within any standard PC, a cell phone, a personal digital assistant (PDA), a wireless application device, etc. By employing the generalized dynamics processor 30, the present invention improves audio transmission across any digital network such as the Internet or a packet switching network as described in detail hereinbelow.

The input block 32 in FIG. 2 receives audio signals from an audio source (not shown in FIG. 2) such as a microphone, a telephone or a music playback system. The input block 32 converts the audio signals into pulse code modulated (PCM) samples, which represent sampled digital data, i.e., data that is sampled at regular basis. Subsequently, at the frequency shaping block 34, the very low and very high frequency components of the PCM samples are eliminated which may otherwise degrade the audio quality of the samples. Examples of the low frequency components are rumble and hum and examples of high frequency components are noise and hiss.

At the 2-band crossover block 36 the audio samples are separated into two partially overlapping frequency bands. Each frequency band is subsequently processed at non-linear automatic gain control (AGC) loop blocks 38 and 40. In the non-linear AGC loops 38 and 40 each of the input samples is multiplied by a number known as the gain factor. Depending on whether the gain factor is greater or lower than 1.0, the volume of the input sample is either increased or decreased for the purpose of equalizing the amplitude of the input samples in each of the frequency bands. The gain factor is variable for different input samples as described in more detail hereinbelow. The distinguishing factor between a non-linear AGC and an AGC is that the gain factor varies according to a nonlinear mathematical function in the non-lineaer AGC. Thus, the output of each of the non-linear AGCs 38 and 40 is the product of the input sample and the gain factor. The output of the two non-linear AGCs is mixed at the mixer block 42 so that in the resulting output all the frequencies are represented.

At the next block, multi-band crossover 44, the PCM samples are broken down into various overlapping frequency bands, which may number 3, 4, 5, 6, 7 or more. In this way, the multi-band crossover 44 behaves very similar to the 2-band crossover 36 except that the former has more frequency bands. The main reason for breaking down the samples into various frequencies is that the volume in each frequency band may be equalized separately and independently from the frequency bands. Independent processing of each frequency band is necessary in most cases such as in music broadcasting where there is a combination of high-pitch, low-pitch and medium-pitch instruments playing simultaneously. In the presence of a high-pitch sound, such as crash of a symbol that is louder than any other instrument for a fraction of a second, a single band AGC would reduce the amplitude of the entire sample including the low and medium frequency components present in the sample that may have originated from a vocalist or a bass. The result is a degradation of audio quality and introduction of undesirable artifacts into the music. A one band AGC would allow the component of frequency with the highest volume to control the entire sample, a phenomenon referred to as spectral gain intermodulation.

According to one implementation of the present invention as shown in FIG. 2, the multi-band crossover 44 allows independent processing of various frequency bands. Consequently the volume of the high-pitch component of the sample may be reduced without affecting the other frequency components, avoiding spectral gain intermodulation.

As shown in FIG. 2 the sample is decomposed into n separate frequency bands. Each band is subsequently treated independently as indicated by processing blocks 60, 62, and 64. Processing block 60 is dedicated to processing band 1 with components possessing the lowest frequency. Block 46, labeled drive 1, represents a type of gain control wherein the gain factor is an adjustable parameter that is preset by the user. For instance the user may decide that in a particular case the quality of music improves when high frequency components are controlled more that the middle and lower frequency components. Then the user presets the drive factors in drive 1 block 46 and all the other drive 1 blocks in the remaining frequency bands to accommodate such an outcome.

The next step in dynamics processing is the processing block AGC 48 wherein the lowest frequency components of the sample are multiplied by a gain factor in order to either increase or decrease the volume accordingly as explained in more detail hereinbelow. The drive 2 block 50 acts in exactly the same manner as drive 1 block 46 except with a different gain factor that is preset by the user. The gain factor set by the user in the drive 2 blocks in all the frequency bands may be different in order to effect a particular outcome.

The next step is the negative attack time limiter 52. In step 52 volume of the frequency band is adjusted based on signals in the future. To elaborate, samples are stored in a delay buffer so that the future samples may be used in equalizing the volume. When the buffer is full, a small block of earlier samples is appended to the beginning of the buffer and a block of samples is saved from the end of the buffer. The future sample is multiplied by the gain factor. If the resulting data has an amplitude greater than a threshold value (a user-fixed parameter) the gain factor is reduced to a value equal to the threshold value divided by the amplitude of the future sample. A counter referred to as the release counter is subsequently set equal to the a length of the delay buffer. The resulting data is then passed through a low-pass filter so as to smooth out any abrupt changes in the gain that will have resulted from multiplication by the future sample.

Finally, the sample in the buffer which has been delayed is multiplied by the gain factor computed above in order to produce the output. Subsequently, the release counter is decremented. If the release counter is less than zero, the gain factor is multiplied by a number slightly greater than 1.0. Finally, the next sample is read and the above process is repeated. Accordingly, calculation of the gain factor in the negative attack time limiter 52 is based on the future sample. The main function of the negative attack time limiter 52 is to ensure that the transition from the present sample to the future sample is achieved in a smooth and inaudible fashion, and to remove peaks on the audio signal that waste band-with.

At the next step 54, the inverse drive 2, the sample is multiplied by a gain factor, which is the reciprocal of the gain factor used in the drive 2 block 50. At the soft clip block 56 the amplitude of the sample is truncated at a certain level of amplitude. However, a smooth signal that is truncated at a certain level of amplitude develops sharp edges. Sharp edges when passed through subsequent stages of processing can result in overshoots that are narrow regions of large amplitude at the two edges of the truncated sample resulting in audio distortion. Soft clipping alleviates the consequences of audible distortion by reducing the amplitude by which the sample overshoots at the edges. However, the overshoots at the edges are not completely eliminated. The soft clip step 56 is peculiar to the lowest frequency band which helps to create a "punchy" bass sound. The remaining n-1 bands lack such a step. The remaining blocks in all the frequency bands are identical.

The level mixer block 58 acts as another gain control wherein the sample is multiplied by a gain factor that is a user-programmable feature of this invention and is preset by the user. The level mixer 58 represents the last stage before outputs of different frequency bands are mixed. Mixing of the outputs of the different frequency bands is performed at the mix block 66. Step 68, the drive, is a gain control that is preset by the user. The drive control at step 68 is applied to the entire sample composed of all the frequencies. Similarly, the negative attack time limiter 70 acts exactly in the same manner as block 52 except that at step 70 the sample with all the frequencies is being processed. Finally, at step 72, the output of the generalized dynamics processor in the form of PCM samples is transmitted to a destination point not shown in FIG. 2.

Figure 3A:
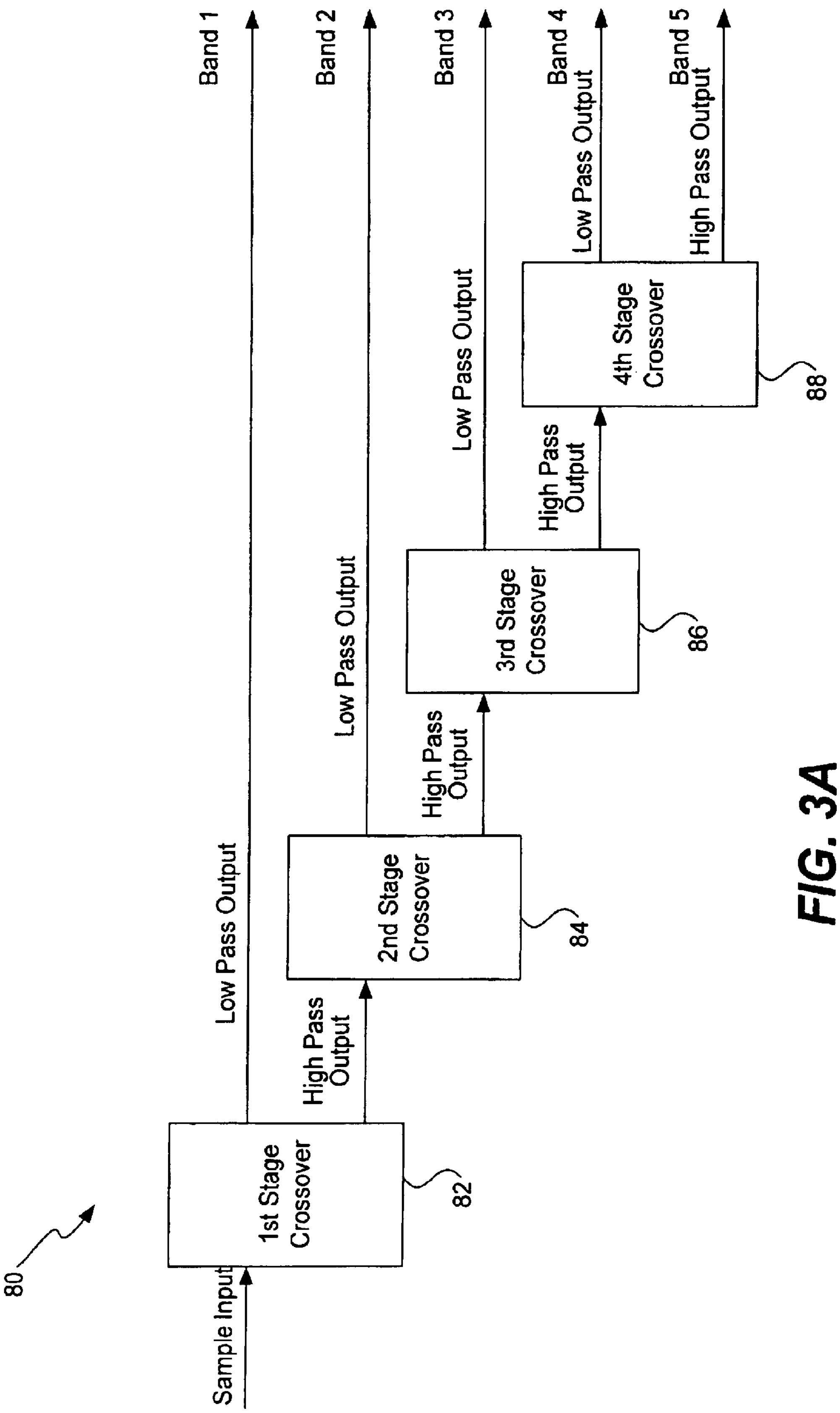
FIG. 3(*a*) shows various stages in the multi-band cross over, according to an implementation of the present invention.
Figure 3B:
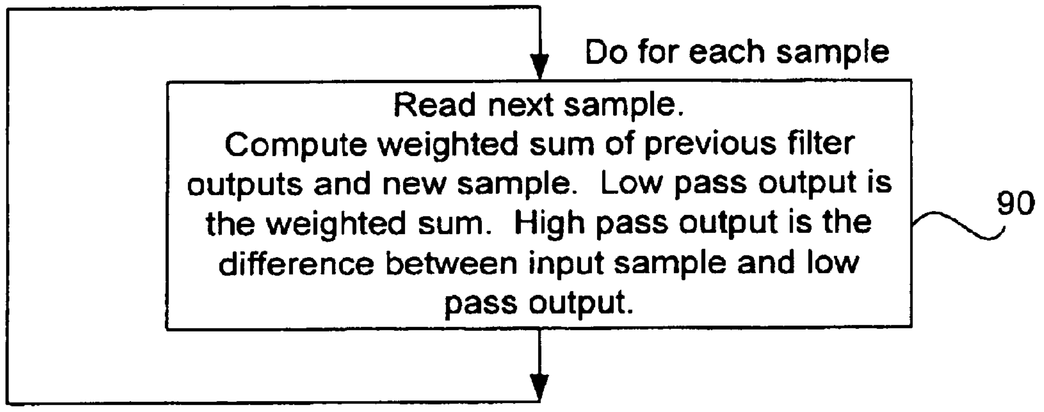

FIGS. 3(*a*) and 3(*b*) show various stages 80 of processing in the multi-band crossover 44 of FIG. 2. At each stage of the multi-band crossover 44, as shown in FIG. 3(*b*), a computation is performed resulting in a high pass output as shown in the loop 90. More specifically, at each stage corresponding to a particular frequency band the next sample as well as the output from the previous stage, referred to as the high pass output, are read. An averaging process is then performed wherein the weighted sum of the previous stage's output and the new sample is computed. The output of the averaging process is labeled the low-pass output in FIGS. 3(*a*) and 3(*b*). Thus, there are n-1 low pass outputs corresponding to the n frequency bands. The difference between the input sample and the low pass output is denoted as the high pass output, which forms the input to the next stage of the multi-band crossover. FIG. 3(*a*) shows four stages corresponding to the $1^{st}$, $2^{nd}$, $3^{rd}$, and $4^{th}$ stages of the multi-band crossover labeled 82–88, respectively. At each stage, except the $1^{st}$ stage 82, the inputs are the input sample and the high pass outputs as calculated according to block 90 and explained hereinabove.

Figure 4:
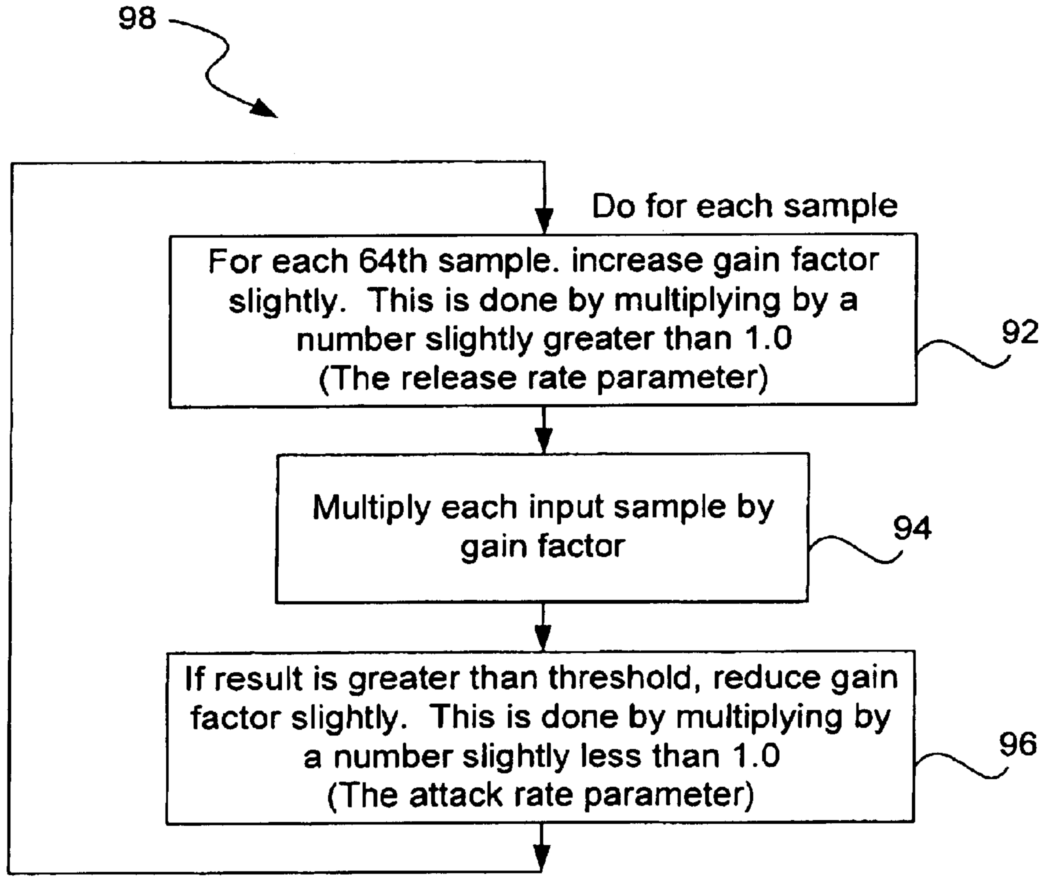
FIG. 4 shows a flowchart outlining various stages in an AGC loop.

FIG. 4 shows a flowchart outlining various stages in an AGC loop 98. The operation of AGC 48 of FIG. 2 was described briefly hereinabove and is now explained in more detail. AGC loop 98 is performed for each new sample that is read by the AGC. Initially a gain factor is assumed and thereafter for each $64^{th}$ sample, as indicated at step 92, the gain factor is increased slightly through multiplication by a number greater than 1.0, referred to as the release rate parameter. In this way, the gain factor increases with every $64^{th}$ sample. Every input sample is multiplied by the gain factor thus obtained, as indicated at step 94. At step 96 it is determined if as the result of multiplication the amplitude of the sample exceeds a preset threshold value. In the event the threshold value is exceeded, the gain factor is reduced slightly through multiplication by a number slightly less than 1.0 known as the attack rate parameter. Otherwise the gain factor remains unaltered and the process repeats by reading a new input sample.

Figure 5:
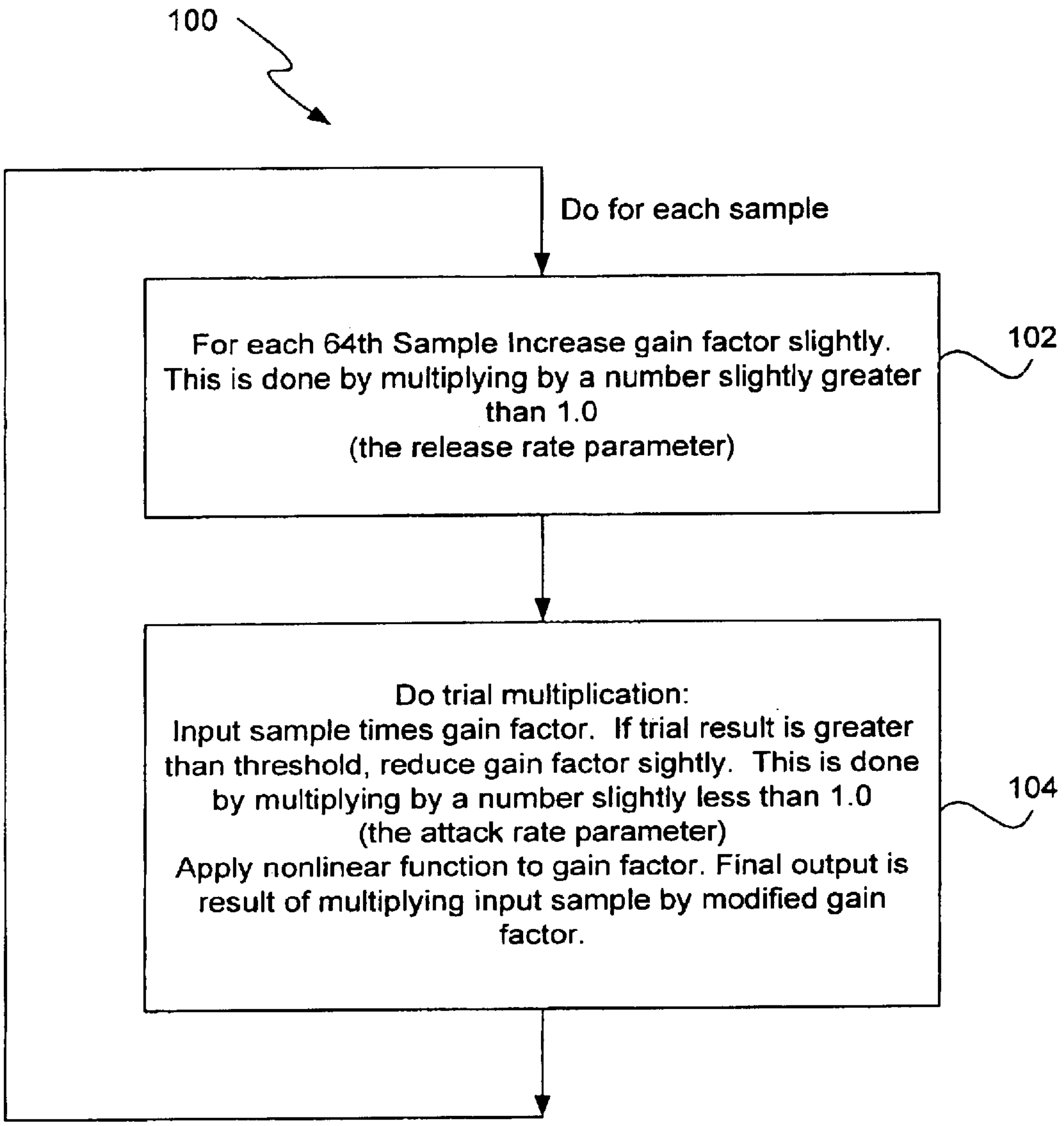
FIG. 5 show a flowchart outlining various stages in a non-linear AGC loop.

FIG. 5 shows a flowchart outlining various stages in a special AGC loop 100. A brief description of the operation of the non-linear AGC loop 38 in FIG. 2 was presented hereinabove. In FIG. 5, additional details regarding the non-linear AGC loop 100 is provided. The non-linear AGC loop 100 is performed for each new input sample. At step 102, the gain factor is increased for every $64^{th}$ sample read by multiplying the gain factor with a number slightly greater than 1.0, i.e. the release rate parameter. At step 104, initially a trial multiplication is performed by multiplying each input sample with the gain factor. If the amplitude of the resulting signal is greater than a preset threshold value, the gain factor is reduced slightly by being multiplied by a number slightly less than 1.0, i.e. the attack rate parameter. The gain factor is then modified according to a nonlinear function.

In one implementation of the present invention, the new gain factor is obtained by dividing the old gain factor by two and adding a fixed value to the outcome, thereby obtaining a nonlinear variation in the gain factor. The final output of the non-linear AGC loop 100 is obtained by multiplying each input sample by the modified gain factor. Thereafter, the process is repeated for the incoming new input samples.

The present invention is implemented entirely in software. In one implementation of the present invention a pentium processor within a standard PC is programmed in assembly language to perform the generalized dynamics processing depicted in FIG. 2, resulting in considerable reduction in both expense and complexity. Furthermore, the present invention is implemented in real-time making it particularly desirable in the transmission of audio signals over any digital network such as the Internet.

Figure 6:
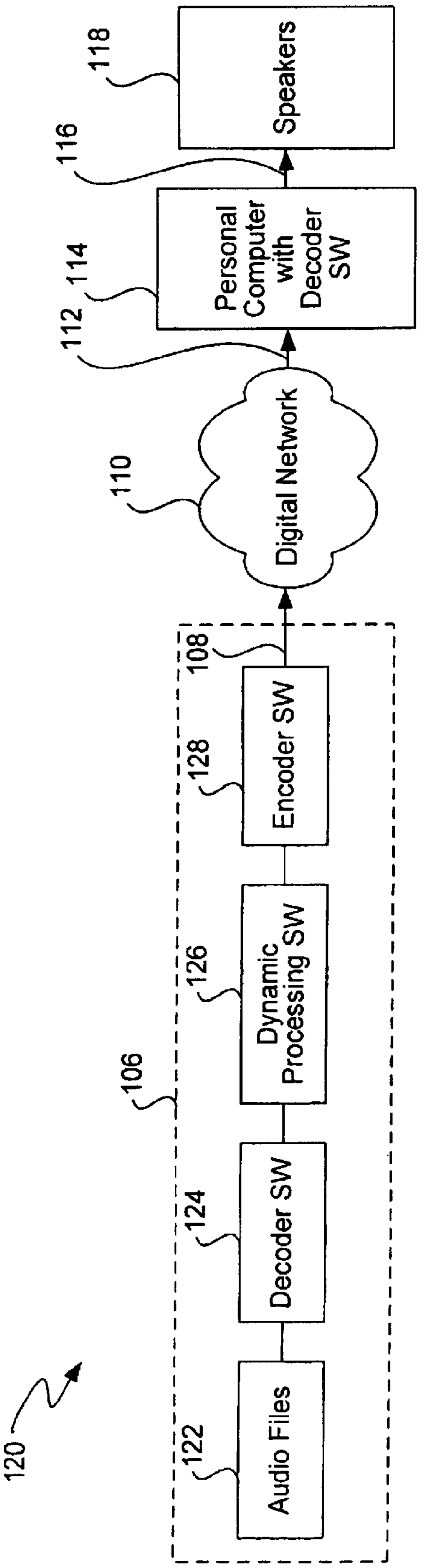
FIG. 6 shows a communication system playing audio files over a network with dynamics processing SW.

FIG. 6 depicts one application of the present invention wherein audio files are played over a digital network with dynamic processing optimization. In FIG. 6 is shown a communication system 120 comprising an audio server 106, a digital network 110, a PC 114 and speakers 118. Audio server 106 is coupled to the digital network 110 through the transmission line 108, which may be a T1 line, the digital network 110 is coupled to the PC 114 through the transmission line 112 and the PC 114 is coupled to the speakers 118 through the line 116.

Within the audio server 106, which may be a PC or several connected PC's, are shown several subunits, that are dedicated to the processing of audio signals. The audio files 122 stored on a disk may be encoded in some type of encoding algorithm such as MP3 within the audio server 106. The audio files are played at step 124 using a decoding SW such as Winamp and are subsequently converted to PCM samples. The PCM samples are then processed by the generalized dynamics processing SW 126, an embodiment thereof is shown in FIG. 2. The output of the dynamics processing SW 126 is encoded again using some type of encoding algorithm such as MP3 and is transmitted through the line 108, across the digital network 110, and through the line 112 to the PC 114. Inside the PC 114, equipped with the appropriate decoding SW such as Winamp, the samples are decoded and converted into audio signals which are then fed to the speakers 118 through the line 116.

Figure 7:
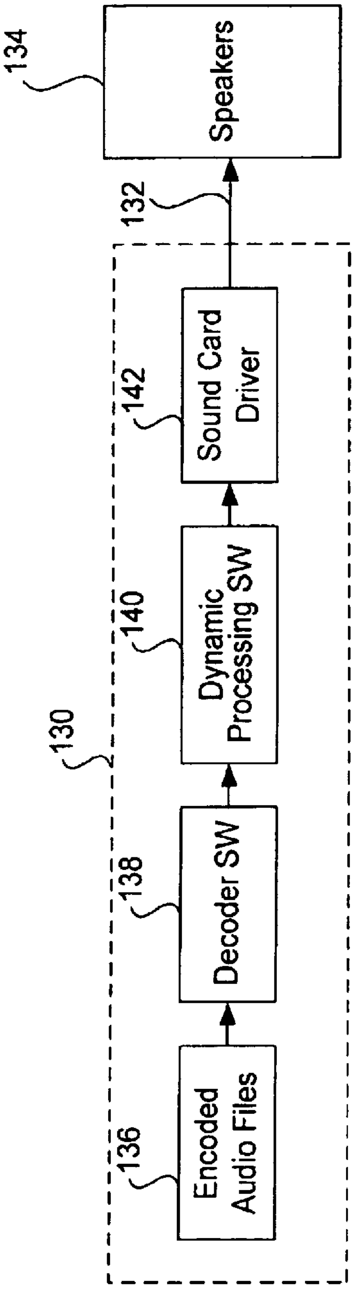
FIG. 7 shows an application of dynamics processing SW in decoding audio files.

FIG. 7 shows another application of the present invention wherein a user is playing audio files stored in a PC 130 with dynamics processing optimization. Shown in FIG. 7 are a PC 130 and speaker 134 coupled through the line 132. The PC 130 may be located inside the user's car and the user may want to use dynamic processing SW in order to improve the quality of sound in the presence of background noise inside the car.

The audio files 136 are encoded using some encoding algorithm such as MP3 inside the PC. The audio files are decoded at step 138 by a decoding SW and are converted to PCM samples. The PCM samples are processed by the dynamics processing SW 140. The dynamics processing SW 140 employed in the PC 130 or in a phone or in a PAD may employ fewer frequency bands and as a result would be less powerful than that described in FIG. 6. The main reason for employing less powerful dynamics processing SW is that the more frequency bands are present within the SW the more computationally intensive the task of dynamic processing becomes; this might be too great a burden on a processor such as the one inside the PC 130. Such limitations do not exist for audio servers such as 106 in FIG. 6 and accordingly more powerful dynamics processing SW are employed therein. The output of the dynamics processing SW in the form of PCM samples is converted to audio signals at the sound card driver 142 which are fed through the line 132 to the speakers 134 to be played.

Figure 8:
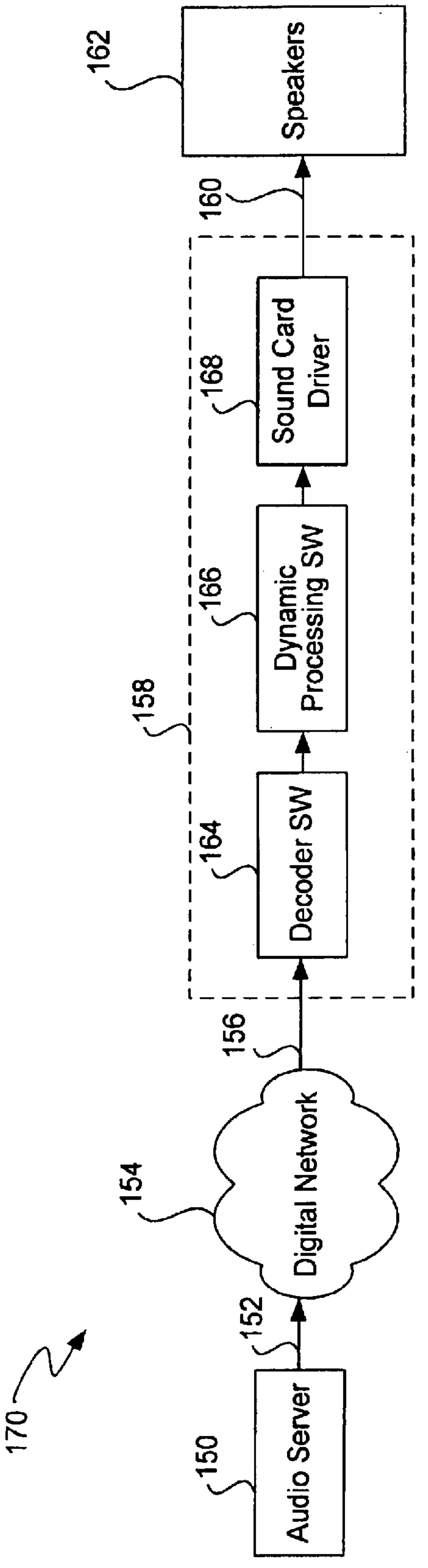
FIG. 8 shows an application of dynamics processing SW at the receiving end of a communication system wherein audio files are decoded.

FIG. 8 shows another application of the present invention wherein the dynamics processing SW is employed at the receiving end of a network communication system. Shown in FIG. 8 is a communication system 170 including an audio server 150, a digital network 154, a PC 158 and speakers 162. The audio server 150 is coupled to the digital network 154 through the transmission line 152 and the digital network 154 is coupled to the PC 158 through the transmission line 156 and the PC 158 is linked to the speakers 162 through the line 160.

The audio server 150 in this case does not include dynamics processing SW. The encoded PCM samples are transmitted from the audio server 150 through the transmission line 152, across the digital network 154 and through the transmission line 156 to the PC 158. Inside the PC 158, the PCM samples are decoded at step 164 using an appropriate decoding SW. At step 166 the PCM samples are processed by the dynamic processing SW. The output of the dynamics processing SW is converted into audio signals by the sound card driver at step 168 and is subsequently fed to the speakers 162 through the line 160 to be played.

As discussed hereinabove, the present invention improves audio transmission across any digital network such as the Internet by enhancing audio quality and intelligibility at reduced bit rates. One of the main advantages of the present invention, as discussed in full detail hereinbelow, is that the processing of the audio signals is performed in real-time without the need for an operator. In addition, the present invention is implemented entirely in software (SW), such as on a standard personal computer (PC), resulting in a system much less expensive and less complex than the sound processing systems presently available.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A dynamics processor comprising:

a non-linear automatic gain control (AGC) responsive to an input audio signal comprised of a plurality of frequency components, each frequency component having associated therewith an amplitude, said non-linear AGC adaptive to develop a modified gain audio signal;

a multiband cross-over device responsive to the modified gain audio signal and adaptive to generate 'n' number of signals, each of said 'n' signals having an amplitude and further having a unique frequency band associated therewith;

'n' number of processing blocks, each of which responsive to a respective one of said 'n' signals for modifying the amplitude of the 'n' signals to develop modified 'n' signals, each of said 'n' number of processing blocks including a processing block AGC, a negative attack time limiter, and a level mixer, the processing block AGC responsive to said respective one of said 'n' signals; and a mixer device responsive to said modified 'n' signals and adaptive to combine the same, wherein the amplitude of the plurality of frequencies associated with the audio signal is modified in real-time thereby enhancing the audibility of the audio signal.

2. A dynamics processor as recited in claim 1 wherein said mixer device is adaptive to provide an output for transmission thereof over the Internet.

3. A dynamics processor as recited in claim 1 wherein said non-linear AGC for multiplying said input audio signal by gain factors varying in a non-linear manner.

4. A dynamics processor as recited in claim 1 comprising a cross-over block responsive to said input audio signal and adaptive to divide the input audio signal into cross-over signals having two or more frequency bands, said dynamics processor including additional non-linear AGCs, each of which responsive to a respective cross-over signal, said non-linear AGCs and non-linear AGC developing at least two pre-input mixer signals.

5. A dynamics processor as recited in claim 4 comprising an input mixer device responsive to said at least two pre-input mixer signals for combining the same to develop said modified gain audio signal.

6. A dynamics processor as recited in claim 1 wherein each of said 'n' number of processing blocks further includes a first drive circuit responsive to said respective one of said 'n' signals and coupled to said processing block AGC, a second drive circuit coupled between said processing block AGC and said negative attack time limiter and an inverse drive circuit coupled between said negative attack time limiter and said level mixer, said first and second drive circuit for adjusting the amplitude of said respective one of said 'n' signals by a gain factor determined by a user.

7. A dynamics processor as recited in claim 6 wherein said level mixer for programmably adjusting the amplitude of said respective one of said 'n' signals by a gain factor.

8. A dynamics processor as recited in claim 6 wherein said inverse drive circuit for adjusting said respective one of said 'n' signals by one divided by the gain factor.

9. A dynamics processor as recited in claim 1 wherein one of said 'n' number of processing blocks includes a soft clip device coupled between said negative attack time limiter and said level mixer and responsive to said respective one of said 'n' signals, said soft clip device for truncating the amplitude of said respective one of said 'n' signals when the amplitude is above a predetermined level thereby developing a signal having overshoots, said overshoots having amplitudes, the soft clip device further for decreasing the amplitude of the overshoots thereby enhancing the audibility of the signal.

10. A computer readable medium having stored therein computer readable program code comprising instructions for performing the following steps:

receiving an input audio signal comprised of a plurality of frequency components, each frequency component having associated therewith an amplitude;

modifying the input audio signal;

generating 'n' number of signals from said modified input audio signal, each of said 'n' signals having an amplitude and further having a unique frequency band associated therewith;

modifying the amplitude of each of the 'n' signals using a processing block AGC, a negative attack time limiter, and a level mixer; and combining said modified 'n' signals, wherein the amplitude of the plurality of frequencies associated with the audio signal is modified in real-time thereby enhancing the audibility of the audio signal.

11. A dynamics processor comprising:

non-linear automatic gain control (AGC) means responsive to an input audio signal comprised of a plurality of frequency components, each frequency component having associated therewith an amplitude, said non-linear AGC adaptive to develop a modified gain audio signal;

multiband cross-over means responsive to the modified gain audio signal and adaptive to generate 'n' number of signals, each of said 'n' signals having an amplitude and further having a unique frequency band associated therewith;

'n' number of processing blocks, each of which responsive to a respective one of said 'n' signals for modifying the amplitude of the 'n' signals, each of said 'n' number of processing blocks including a processing block AGC, a negative attack time limiter, and a level mixer, the processing block AGC responsive to said respective one of said 'n' signals; and mixer means responsive to said modified 'n' signals and adaptive to combine the same, wherein the amplitude of the plurality of frequencies associated with the audio signal is modified in real-time thereby enhancing the audibility of the audio signal.

12. A dynamics processor as recited in claim 11 wherein said non-linear AGC means for multiplying said input audio signal by gain factors varying in a non-linear manner.

13. A dynamics processor as recited in claim 11 comprising a cross-over block responsive to said input audio signal and adaptive to divide the input audio signal into cross-over signals having two or more frequency bands, said dynamics processor including additional non-linear AGC means, each of which responsive to a respective cross-over signal, said non-linear AGC means and non-linear AGC means for developing at least two pre-input mixer signals.

14. A dynamics processor as recited in claim 13 comprising an input mixer means responsive to said at least two pre-input mixer signals for combining the same to develop said modified gain audio signal.

15. A dynamics processor as recited in claim 11 wherein each of said 'n' number of processing blocks further includes a first driver responsive to said respective one of said 'n' signals and coupled to said processing block AGC, a second driver coupled between said processing AGC and said negative attack time limiter and an inverse driver coupled between said negative attack time limiter and said level mixer.

* * * * *